United States Patent
Choe (10) Patent No.: US 6,750,679 B1
(45) Date of Patent: *Jun. 15, 2004

(54) CLOCKED FULL-RAIL DIFFERENTIAL LOGIC WITH SENSE AMPLIFIER AND SINGLE-RAIL LOGIC

(75) Inventor: Swee Yew Choe, Milpitas, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/328,798

(22) Filed: Dec. 24, 2002

(51) Int. Cl.$^7$ ............................................. H03K 19/096
(52) U.S. Cl. ......................... 326/95; 326/98; 326/121; 365/205
(58) Field of Search ........................ 326/95, 98, 121; 365/205

(56) References Cited

U.S. PATENT DOCUMENTS

| | | | | |
|---|---|---|---|---|
| 4,247,791 A | | 1/1981 | Rovell | 307/238 |
| 5,859,548 A | * | 1/1999 | Kong | 326/113 |
| 6,211,704 B1 | * | 4/2001 | Kong | 326/121 |
| 6,496,039 B1 | * | 12/2002 | Choe | 326/95 |
| 6,614,264 B2 | * | 9/2003 | Choe et al. | 326/95 |
| 6,624,664 B2 | * | 9/2003 | Choe et al. | 326/95 |
| 6,630,846 B2 | * | 10/2003 | Choe | 326/95 |
| 2003/0132779 A1 | * | 7/2003 | Yoo et al. | 326/81 |

OTHER PUBLICATIONS

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, Mar. 2nd 2000 vol. 36 No. 5, Mar. 2, 2000, pp. 404 to 405.

Kong et al., "Charge Recycling Differential Logic for Low–Power Application", ISSC96 secession 18, IEEE 0–780331962/98, 1998, pp. 302 to 448.

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4455–3/98, 1998, pp. II–157 to II–160.

Kong et al., "Charge Recycling Differential Logic (CRDL) for Low–Power Application", IEEE Journal of Solid State Circuits, vol. 31, No. 9, Sep. 1996, pp. 1267 to 1276.

* cited by examiner

Primary Examiner—Michael Tokar
Assistant Examiner—Khai Nguyen
(74) Attorney, Agent, or Firm—Gunnison, McKay & Hodgson, L.L.P.; Philip J. McKay (57) ABSTRACT

Clocked full-rail differential logic circuits with sense amplifier and single-rail logic are activated by a delayed clock and include a sense amplifier circuit that is triggered by a second delayed clock. In Addition, according to the invention, the complementary logic function of the prior art is replaced by a single transistor appropriately sized to provide the complementary output. Consequently, the clocked full-rail differential logic circuits with sense amplifier and single-rail logic of the invention are smaller, less complex and are capable of operating efficiently under heavy load conditions without the increased size and the significant reduction in speed associated with prior art full-rail differential logic circuits.

15 Claims, 6 Drawing Sheets

CLOCKED FULL-RAIL DIFFERENTIAL LOGIC WITH SENSE AMPLIFIER AND SINGLE-RAIL LOGIC

FIELD OF THE INVENTION

The present invention relates generally to logic circuits and, more particularly, to full-rail differential logic circuits.

BACKGROUND OF THE INVENTION

One example of a prior art full-rail differential logic circuit is presented and discussed at page 112, and shown in FIG. 3(c), in "HIGH SPEED CMOS DESIGN STYLES" by Bernstein et al. of IBM Microelectronics; Kluwer Academic Publishers, 101 Philip Drive, Assinippi Park, Norwell, Mass., 02061; ISBN 0-7923-8220-X, hereinafter referred to as the Bernstein et al. reference, which is incorporated herein by reference, in its entirety, for all purposes.

Figure 1A:
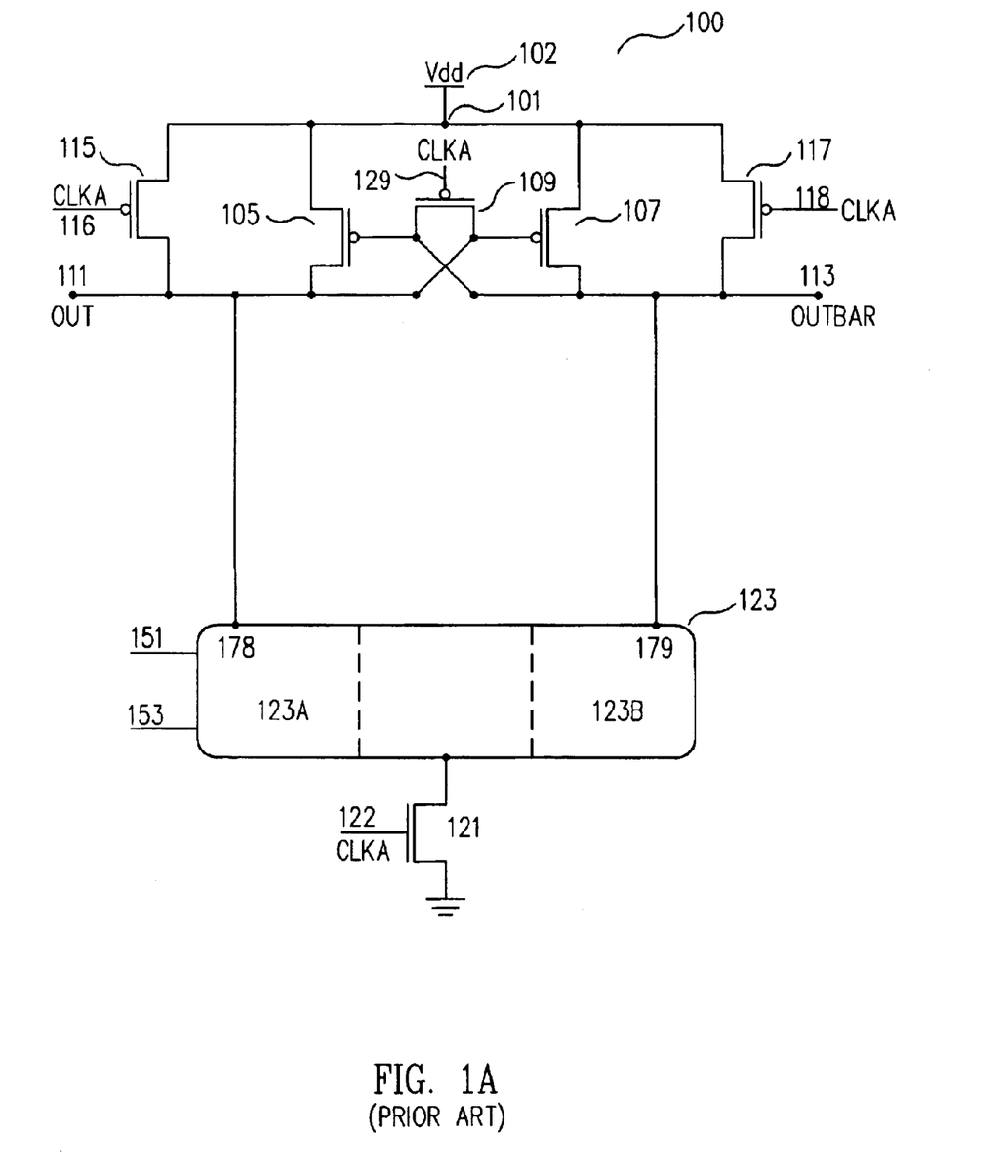
FIG. 1A shows a schematic diagram of a prior art full-rail differential logic circuit.

FIG. 1 shows a prior art full-rail differential logic circuit 100 similar to that discussed in the Bernstein et al. reference. As seen in FIG. 1A, prior art full-rail differential logic circuit 100 included six transistors: PFET 105, PFET 107, PFET 109, PFET 115, PFET 117 and NFET 121. Prior art full-rail differential logic circuit 100 also included: OUT terminal 111 coupled to a terminal 178 of a base logic portion 123A of a logic block 123 and OUTBAR terminal 113 coupled to a terminal 179 of a complementary logic portion 123B of logic block 123. Prior art full-rail differential logic circuit 100 is activated from a delayed clock signal CLKA. As shown in FIG. 1A, signal CLKA was supplied to: gate 116 of PFET 115; gate 118 of PFET 117; gate 129 of PFET 109; and gate 122 of NFET 121.

Prior art full-rail differential logic circuit 100 worked reasonably well under conditions of a light load, for instance under conditions where fan out is less than four. However, prior art full-rail differential logic circuit 100 was less useful under conditions of a heavy load, for instance, in cases where fan out exceeded four. The shortcomings of prior art full-rail differential logic circuit 100 arose primarily because under heavy load conditions logic network 123 had to be increased in size to act as a driver for the next stage in the cascade. This in turn meant that logic network 123 was large, slow and inefficient. The problem was further aggravated as additional prior art full-rail differential logic circuits 100 were cascaded together to form the chains commonly used in the industry. Consequently, the full potential of prior art full-rail differential logic circuit 100 was not realized and their use was narrowly limited to light load applications.

In addition, as noted above, since prior art full-rail differential logic circuit 100 was a dual rail logic circuit, requiring an output OUT 111 and a complementary output OUTBAR 113, in the prior art, logic block 123 had to include both a base logic function, via base logic portion 123A of logic block 123, such as an AND gate, OR gate, XOR gate, etc. and the complementary logic function, via complementary logic portion 123B of logic block 123, such as a NAND gate, NOR gate, XNOR gate, etc.

Figure 1B:
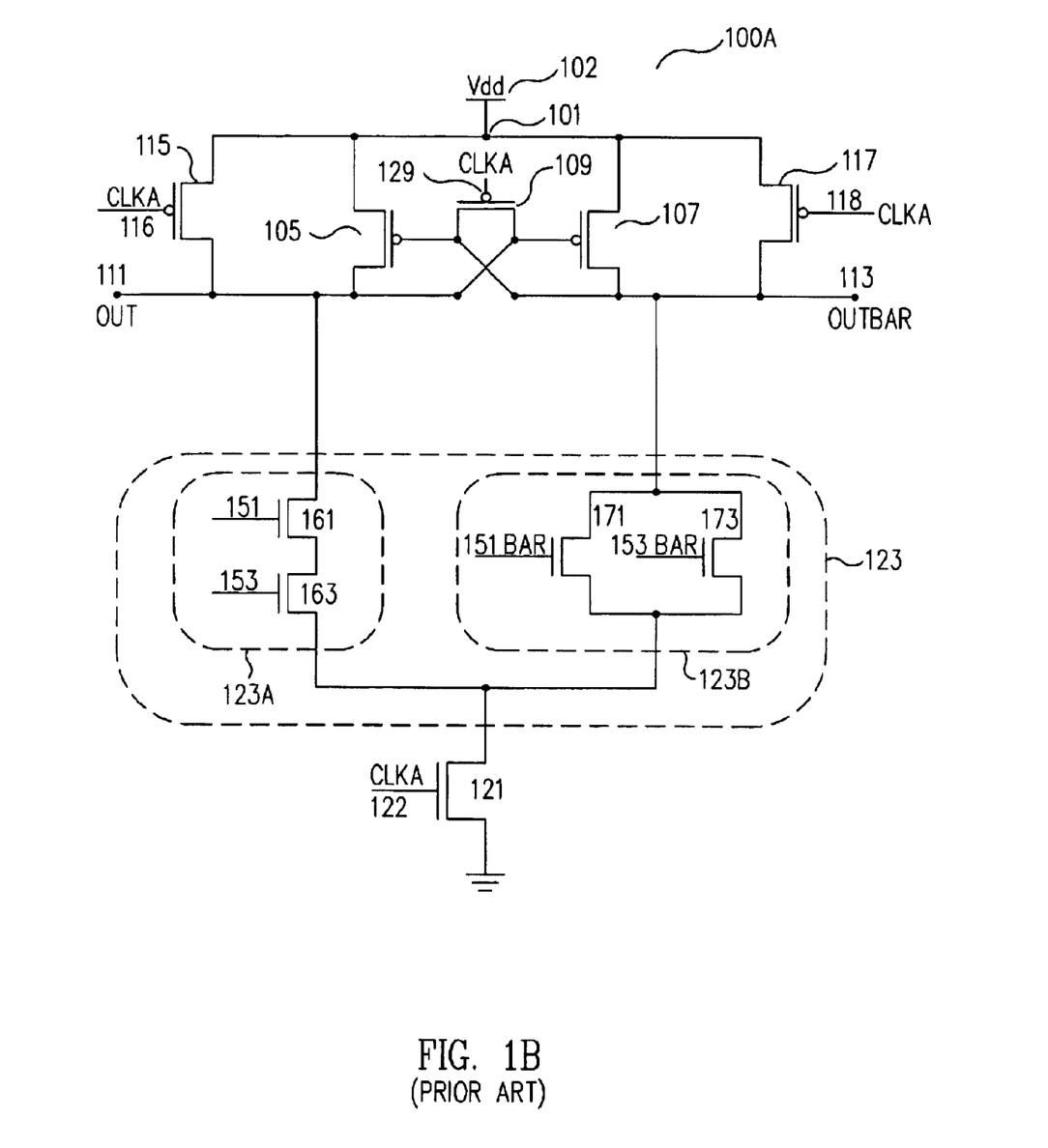
FIG. 1B shows one particular embodiment of a prior art full-rail differential logic circuit that includes a base logic portion that is an AND gate and a complementary logic portion that is a NAND gate.

FIG. 1B shows one particular embodiment of a prior art full-rail differential logic circuit 100A that includes a base logic portion 123A that is an AND gate and a complementary logic port-ion 123B that is a NAND gate. As shown in FIG. 1B, AND gate 123A includes NFET 161 and NFET 163 connected in series. Input 151 is coupled to the control electrode, or gate, of NFET 161 and input 153 is coupled to the control electrode or gate of NFET 163. As also shown in FIG. 1B, NAND gate 123A includes NFET 171 and NFET 173 connected in parallel. Input 151BAR is coupled to the control electrode, or gate, of NFET 171 and input 153BAR is coupled to the control electrode or gate of NFET 173. Consequently, in the prior art, four transistors were required to provide the output OUT 111 and its complementary output OUTBAR 113.

This need in the prior art to include both a base logic function and its complementary logic function resulted in an increase in power usage, an increase in space used, an increase in design complexity, and an increase in heat production.

What is needed is a method and apparatus for creating full-rail differential logic circuits that are capable of efficient use under heavy loads and are more flexible, more space efficient and more reliable than prior art full-rail differential logic circuits.

SUMMARY OF THE INVENTION

The clocked full-rail differential logic circuits with sense amplifier and single-rail logic of the invention include a sense amplifier circuit that is triggered by the delayed clock of the following stage, i.e., the clock input to the sense amplifier circuit of the clocked full-rail differential logic circuits with sense amplifier and single-rail logic of the invention is additionally delayed with respect to the delayed clock that drives the full-rail differential logic. The addition of the sense amplifier circuit, and second delayed clock signal, according to the invention, allows the sense amplifier circuit to act as the driver and therefore there is no need for increasing the size of the logic network to provide the driver function. Consequently, the clocked full-rail differential logic circuits with sense amplifier and single-rail logic of the invention are capable of operating efficiently under heavy load conditions without the increased size and the significant reduction in speed associated with prior art full-rail differential logic circuits. As a result, the clocked full-rail differential logic circuits with sense amplifier and single-rail logic of the invention require less space, are simpler, dissipate less heat and have fewer components to potentially fail.

In addition, according to the invention, the complementary logic function of the prior art is replaced by a single transistor appropriately sized to provide the complementary output OUTBAR. Consequently, clocked full-rail differential logic circuits with sense amplifier and single-rail logic of the invention use less power and, therefore, generate less heat, require less space, and are simpler in design so that they are more flexible, more space efficient and more reliable than prior art full-rail differential logic circuits.

The clocked full-rail differential logic circuits with sense amplifier and single-rail logic of the invention can be cascaded together to form the chains commonly used in the industry. When the clocked full-rail differential logic circuits with sense amplifier and single-rail logic of the invention are cascaded together, the advantages of the clocked full-rail differential logic circuits with sense amplifier and single-rail logic of the invention are particularly evident and the gains in terms of efficiency, size reduction and flexibility are further pronounced.

In particular, one embodiment of the invention is a cascaded chain of clocked full-rail differential logic circuits with sense amplifier and single-rail logic of the invention. The chain includes a first clocked full-rail differential logic circuit with sense amplifier and single-rail logic. The first clocked full-rail differential logic circuit with sense amplifier and single-rail logic includes: a first clocked full-rail differential logic circuit with sense amplifier and single-rail logic first clock input terminal; at least one first clocked full-rail differential logic circuit with sense amplifier and single-rail logic data input terminal; at least one first clocked full-rail differential logic circuit with sense amplifier and single-rail logic data output terminal; and a first clocked full-rail differential logic circuit with sense amplifier and single-rail logic second clock input terminal.

The cascaded chain of the invention also includes a second clocked full-rail differential logic circuit with sense amplifier and single-rail logic. The second clocked full-rail differential logic circuit with sense amplifier and single-rail logic includes: a second clocked full-rail differential logic circuit with sense amplifier and single-rail logic first clock input terminal; at least one second clocked full-rail differential logic circuit with sense amplifier and single-rail logic data input terminal; at least one second clocked full-rail differential logic circuit with sense amplifier and single-rail logic data output terminal; and a second clocked full-rail differential logic circuit with sense amplifier and single-rail logic second clock input terminal.

According to the invention, the at least one first clocked full-rail differential logic circuit with sense amplifier and single-rail logic data output terminal is coupled to the at least one second clocked full-rail differential logic circuit with sense amplifier and single-rail logic data input terminal to form the chain. According to the invention, a first clock signal is coupled to the first clocked full-rail differential logic circuit with sense amplifier and single-rail logic first clock input terminal and a second clock signal is coupled to the first clocked full-rail differential logic circuit with sense amplifier and single-rail logic second clock input terminal and the second clocked full-rail differential logic circuit with sense amplifier and single-rail logic first clock input terminal. According to the invention, the second clock signal is delayed with respect to the first clock signal by a predetermined delay time.

In one embodiment of the invention, a delay circuit is coupled between the first clocked full-rail differential logic circuit with sense amplifier and single-rail logic clock input terminal and the second clocked full-rail differential logic circuit with sense amplifier and single-rail logic first clock input terminal to provide the predetermined delay time. In one embodiment of the invention, the delay circuit is also coupled between the first clocked full-rail differential logic circuit with sense amplifier and single-rail logic clock input terminal and the first clocked full-rail differential logic circuit with sense amplifier and single-rail logic second clock input terminal to provide the predetermined delay time.

One embodiment of the invention is a clocked full-rail differential logic circuit with sense amplifier and single-rail logic that includes a clocked full-rail differential logic circuit with sense amplifier and single-rail logic out terminal and a clocked full-rail differential logic circuit with sense amplifier and single-rail logic outBar terminal.

In one embodiment of the invention, the clocked full-rail differential logic circuit with sense amplifier and single-rail logic also includes a first node, the first node is coupled to a first supply voltage.

In one embodiment of the invention, the clocked full-rail differential logic circuit with sense amplifier and single-rail logic also includes a first transistor, the first transistor including a first transistor first flow electrode, a first transistor second flow electrode and a first transistor control electrode. The first node is coupled to the first transistor first flow electrode and the first transistor second flow electrode is coupled to the clocked full-rail differential logic circuit with sense amplifier and single-rail logic out terminal. The first transistor can also include a back bias input terminal having a back bias voltage thereon.

In one embodiment of the invention, the clocked full-rail differential logic circuit with sense amplifier and single-rail logic also includes a second transistor, the second transistor including a second transistor first flow electrode, a second transistor second flow electrode and a second transistor control electrode. The first node is coupled to the second transistor first flow electrode and the second transistor second flow electrode is coupled to the clocked full-rail differential logic circuit with sense amplifier and single-rail logic outBar terminal.

In one embodiment of the invention, the clocked full-rail differential logic circuit with sense amplifier and single-rail logic also includes a third transistor, the third transistor including a third transistor first flow electrode, a third transistor second flow electrode and a third transistor control electrode. The first transistor control electrode is coupled to the third transistor first flow electrode and the clocked full-rail differential logic circuit with sense amplifier and single-rail logic outBar terminal. The second transistor control electrode is coupled to the third transistor second flow electrode and the clocked full-rail differential logic circuit with sense amplifier and single-rail logic out terminal. The third transistor control electrode is coupled to a clock signal CLKA.

In one embodiment of the invention, the clocked full-rail differential logic circuit with sense amplifier and single-rail logic also includes a fourth transistor, the fourth transistor including a fourth transistor first flow electrode, a fourth transistor second flow electrode and a fourth transistor control electrode. The first node is coupled to the fourth transistor first flow electrode and the fourth transistor second flow electrode is coupled to the clocked full-rail differential logic circuit with sense amplifier and single-rail logic out terminal. The fourth transistor control electrode is coupled to the clock signal CLKA. The fourth transistor can also include a back bias input terminal having a hack bias voltage thereon.

In one embodiment of the invention, the clocked full-rail differential logic circuit with sense amplifier and single-rail logic also includes a fifth transistor, the fifth transistor including a fifth transistor first flow electrode, a fifth transistor second flow electrode and a fifth transistor control electrode. The first node is coupled to the fifth transistor first flow electrode and the fifth transistor second flow electrode is coupled to the clocked full-rail differential logic circuit with sense amplifier and single-rail logic outBar terminal. The fifth transistor control electrode is coupled to the clock signal CLKA. The fifth transistor can also include a back bias input terminal having a back bias voltage thereon.

In one embodiment of the invention, the clocked full-rail differential logic circuit with sense amplifier and single-rail logic also includes a sense amplifier circuit coupled between the clocked full-rail differential logic circuit with sense amplifier and single-rail logic out terminal and the clocked full-rail differential logic circuit with sense amplifier and single-rail logic outBar terminal.

The clocked full-rail differential logic circuit with sense amplifier and single-rail logic also includes a base logic portion, the base logic portion including a base logic portion first input terminal and a base logic portion second input terminal.

The clocked full-rail differential logic circuit with sense amplifier and single-rail logic also includes a complementary output transistor, the complementary output transistor including a complementary output transistor first flow electrode, a complementary output transistor second flow electrode and a complementary output transistor control electrode. According to the invention, the complementary output transistor first flow electrode is coupled to the second flow electrode of the third transistor, the second flow electrode of the fifth transistor and the OUTBAR terminal of the clocked full-rail differential logic circuit with sense amplifier and single-rail logic. The complementary output transistor second flow electrode is coupled to a first flow electrode of a tenth transistor. The complementary output transistor control electrode is coupled to the second flow electrode of the third transistor and the OUT terminal of the clocked full-rail differential logic circuit with sense amplifier and single-rail logic.

As discussed in more detail below, the clocked full-rail differential logic circuits with sense amplifier and single-rail logic of the invention are capable of efficient use under heavy loads and are therefore more flexible, more space efficient and more reliable than prior art full-rail differential logic circuits.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

The clocked full-rail differential logic circuits with sense amplifier and single-rail logic (200 in FIG. 2A, 200A in FIG. 2B, and 300A, 300B, 300C and 300N in FIG. 3) of the invention include a sense amplifier circuit (280 in FIG. 2A and FIG. 2B) that is triggered by the delayed clock (CLKB in FIG. 2A and FIG. 2B and FIG. 3 and CLKC, CLKD, CLKN+1 in FIG. 3) of the following stage, i.e., the clock input to the sense amplifier circuit of the clocked full-rail differential logic circuits with sense amplifier and single-rail logic of the invention is additionally delayed with respect to the delayed clock that drives the full-rail differential logic. The addition of the sense amplifier circuit and second delayed clock signal, according to the invention, allows the sense amplifier circuit to act as the driver and therefore there is no need for increasing the size of the logic network (123A in FIG. 2A and FIG. 2B) to provide the driver function. Consequently, the clocked full-rail differential logic circuits with sense amplifier and single-rail logic of the invention are capable of operating efficiently under heavy load conditions without the significant reduction in speed associated with prior art full-rail differential logic circuits. Also, the clocked full-rail differential logic circuits with sense amplifier and single-rail logic of the invention require less space, are simpler, dissipate less heat and have fewer components to potentially fail.

In addition, the clocked full-rail differential logic circuits with sense amplifier and single-rail logic of the invention do not include complementary logic portions (123B in FIGS. 1A and 1B). According to the invention, the complementary logic function of the prior art is replaced by a single complementary output transistor (281 in FIGS. 2A and 2B) appropriately sized to provide the complementary output OUTBAR (213 in FIGS. 2A and 2B). Consequently, clocked full-rail differential logic circuits with sense amplifier and single-rail logic of the invention use less power and, therefore, generate less heat, require less space, and are simpler in design so that they are more flexible, more space efficient and more reliable than prior art full-rail differential logic circuits.

The clocked full-rail differential logic circuits with sense amplifier and single-rail logic of the invention can be cascaded together to form the chains (301 in FIG. 3) commonly used in the industry. When the clocked full-rail differential logic circuits with sense amplifier and single-rail logic of the invention are cascaded together, the advantages of the clocked full-rail differential logic circuits with sense amplifier and single-rail logic of the invention are particularly evident and the gains in terms of efficiency, size reduction and flexibility are further pronounced.

Figure 2A:
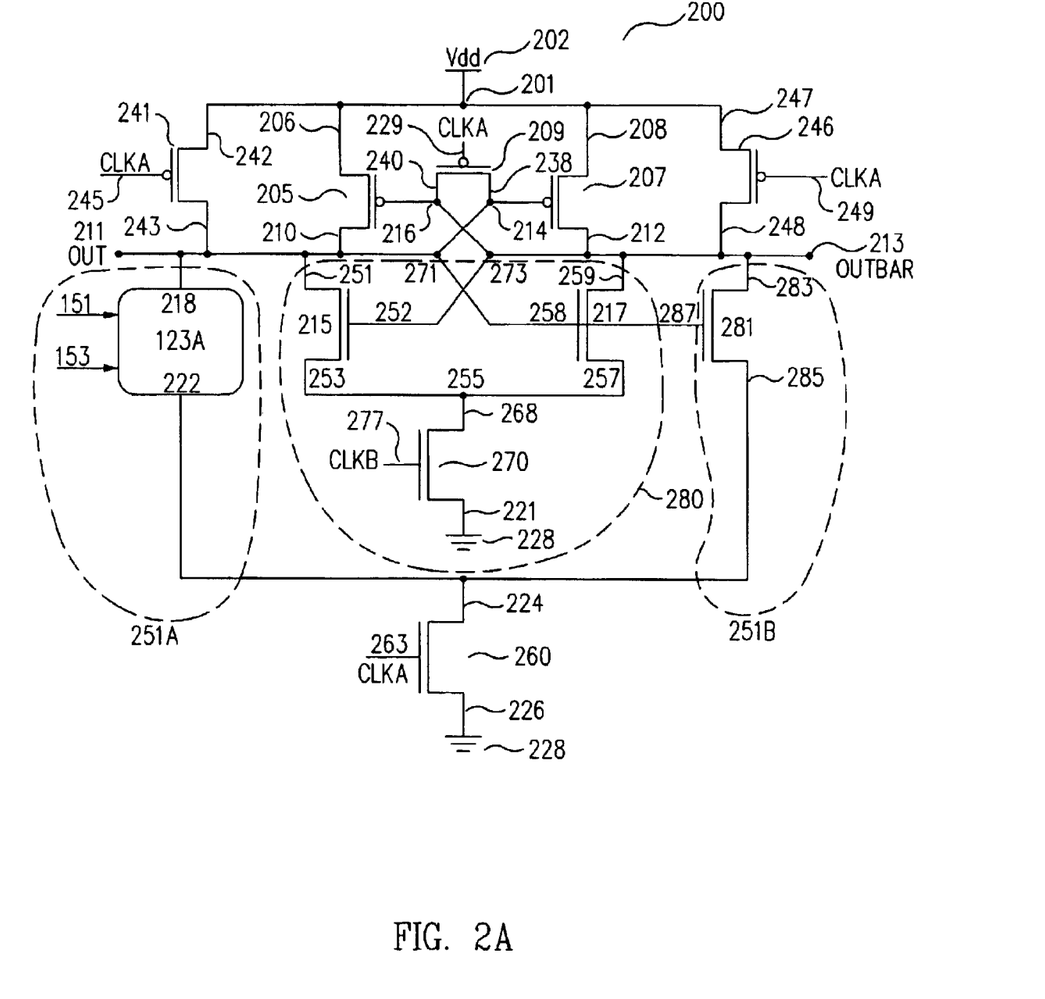
FIG. 2A shows a schematic diagram of one embodiment of a clocked full-rail differential logic circuit with sense amplifier and single-rail logic designed according to the principles of the present invention.

FIG. 2A shows a schematic diagram of one embodiment of a clocked full-rail differential logic circuit with sense amplifier and single-rail logic 200 designed according to the principles of the present invention. As seen in FIG. 2A, clocked full-rail differential logic circuit with sense amplifier and single-rail logic 200 includes a first supply voltage 202 coupled to a first node 201. First node 201 is coupled to: a source 206 of a first transistor, PFET 205; a source 208 of a second transistor, PFET 207; a source 242 of a fourth transistor, PFET 241 and a source 247 of a fifth transistor, PFET 246. The clock signal CLKA is coupled to: a control electrode or gate 245 of PFET 241; a control electrode or gate 249 of PFET 246; a control electrode or gate 229 of a third transistor, PFET 209; a control electrode or gate 263 of a tenth transistor, NFET 260.

A control electrode or gate 216 of PFET 205 is coupled to a source 240 of PFET 209 and an outBar terminal 213. A control electrode or gate 214 of PFET 207 is coupled to a drain 238 of PFET 209 and an out terminal 211. A drain 210 of PFET 205 is coupled to out terminal 211 and a drain 212 of PFET 207 is coupled to outBar terminal 213.

As discussed above, gate 245 of PFET 241 is coupled to clock signal CLKA, as is gate 249 of PFET 246. A drain 243 of PFET 241 is coupled to out terminal 211 and a drain 248, of PFET 249 is coupled to outBar terminal 213.

According to the invention, clocked full-rail differential logic circuit with sense amplifier and single-rail logic 200 also includes sense amplifier circuit 280. In one embodiment of the invention, sense amplifier circuit 280 includes a sixth transistor, NFET 215 including a drain 251, a source 253 and a control electrode or gate 252. Drain 210 of PFET 205 is coupled to drain 251 of NFET 215. Source 253 of NFET 215 is coupled to a second node 255. Gate 252 of NFET 215 is coupled to source 240 of PFET 209 and clocked full-rail differential logic circuit with sense amplifier and single-rail logic outBar terminal 213.

In one embodiment of the invention, sense amplifier circuit 280 also includes a seventh transistor, NFET 217 including a drain 259, a source 257 and a control electrode or gate 258. Drain 212 of PFET 207 is coupled to drain 259 of NFET 217. Source 257 of NFET 217 is coupled to second node 255. Gate 258 of NFET 217 is coupled to drain 238 of PFET 209 and clocked full-rail differential logic circuit with sense amplifier and single-rail logic out terminal 211.

In one embodiment of the invention, sense amplifier circuit 280 of clocked full-rail differential logic circuit with sense amplifier and single-rail logic 200 also includes an eighth transistor, NFET 270, including a drain 268, a source 221 and a control electrode or gate 227. Drain 268 of NFET 270 is coupled to second node 255. Source 221 of NFET 270 is coupled to a second supply voltage 228. A delayed clock signal CLKB is coupled to control electrode or gate 277 of NFET 270. According to one embodiment of the invention, clock signal CLKB is delayed with respect to clock signal CLKA by a predetermined time.

According to one embodiment of the invention, clocked full-rail differential logic circuit with sense amplifier and single-rail logic out terminal 211 is coupled to a first terminal 218 of a base logic portion 123A. Base logic portion 123A includes any type of differential logic and/or circuitry used in the art including various logic gates, logic devices and circuits such as AND gates, OR gates, XOR gates etc. Base logic portion 123A also includes first and second input terminals 151 and 153 that are typically coupled to an OUT and OUTBAR terminal of a previous clocked full-rail differential logic circuit with sense amplifier and single-rail logic stage (not shown).

Base logic portion 123A also includes fourth terminal 222 coupled to a drain, or first flow electrode 224, of a tenth transistor, NFET 260. A gate or control electrode 263 of NFET 260 is coupled to the signal CLKA and a source, or second flow electrode 226, of NFET 260 is coupled to a second supply voltage 228.

According to the invention, clocked full-rail differential logic circuit with sense amplifier and single-rail logic 200 also includes a ninth transistor called complementary output transistor 281. Complementary output transistor 281 includes a complementary output transistor first flow electrode 283, a complementary output transistor second flow electrode 285 and a complementary output transistor control electrode 287. According to the invention, complementary output transistor first flow electrode 283 is coupled to second flow electrode 212 of PFET 207 and OUTBAR terminal 213 of clocked full-rail differential logic circuit with sense amplifier and single-rail logic 200. Complementary output transistor second flow electrode 285 is coupled to first flow electrode 224 of NFET 260. According to the invention, complementary output transistor control electrode 287 is coupled to second flow electrode 238 of the PFET 209 and OUT terminal 211 of clocked full-rail differential logic circuit with sense amplifier and single-rail logic 200.

A particular embodiment of a clocked full-rail differential logic circuit with sense amplifier and single-rail logic 200 according to the invention is shown in FIG. 2A. Those of skill in the art will recognize that clocked full-rail differential logic circuit with sense amplifier and single-rail logic 200 can be easily modified. For example, different transistors, i.e., PFETs 205, 207, 209, 241, and 246 or NFETs 215, 217, 260 and 270 can be used. In particular, the NFETs and PFETS shown in FIG. 2A can be readily exchanged for PFETs and NFETs by reversing the polarities of the supply voltages 202 and 228, or by other well known circuit modifications. Consequently, the clocked full-rail differential logic circuit with sense amplifier and single-rail logic 200 that is shown in FIG. 2A is simply one embodiment of the invention used for illustrative purposes only and does not limit the present invention to that one embodiment of the invention.

As discussed above, clocked full-rail differential logic circuit with sense amplifier and single-rail logic 200 of the invention includes sense amplifier circuit 280 that is triggered by delayed clock signal CLKB of the following stage, i.e., the clock signal CLKB to gate 277 of NFET 270 of sense amplifier circuit 280 is additionally delayed with respect to the delayed clock signal CLKA. Clock signal CLKA is coupled to: gate 245 of PFET 241; gate 229 of PFET 209; gate 249 of PFET 246 and gate 263 of NFET 260. The addition of sense amplifier circuit 280 and second delayed clock signal CLKB, according to the invention, allows sense amplifier circuit 280 to act as the driver and therefore there is no need for increasing the size of the logic block 123A to provide the driver function. Consequently, clocked full-rail differential logic circuit with sense amplifier and single-rail logic 200 of the invention is capable of operating efficiently under heavy load conditions without the significant reduction in speed associated with prior art full-rail differential logic circuits 100. In addition, clocked full-rail differential logic circuit with sense amplifier and single-rail logic 200 requires less space, is simpler, dissipates less heat and has fewer components to potentially fail.

As shown above, according to the invention, the complementary logic portion 123B in FIGS. 1A and 1B, is eliminated and replaced by complementary output transistor 281 (FIG. 2A). According to the invention, complementary output transistor 281 is sized, i.e., has channel dimensions, e.g., channel width, which are smaller than the effective channel dimensions, e.g., effective channel width, of the transistors making up base logic portion 123A. According to the invention, this is specifically done to insure that discharge path 251A, between OUT terminal 211 and second supply voltage 228 through base logic portion 123A, is faster than the discharge path 251B, between OUTBAR terminal 213 and second supply voltage 228, through complementary output transistor 281, to insure proper operation of clocked full-rail differential logic circuit with sense amplifier and single-rail logic 200.

Figure 2B:
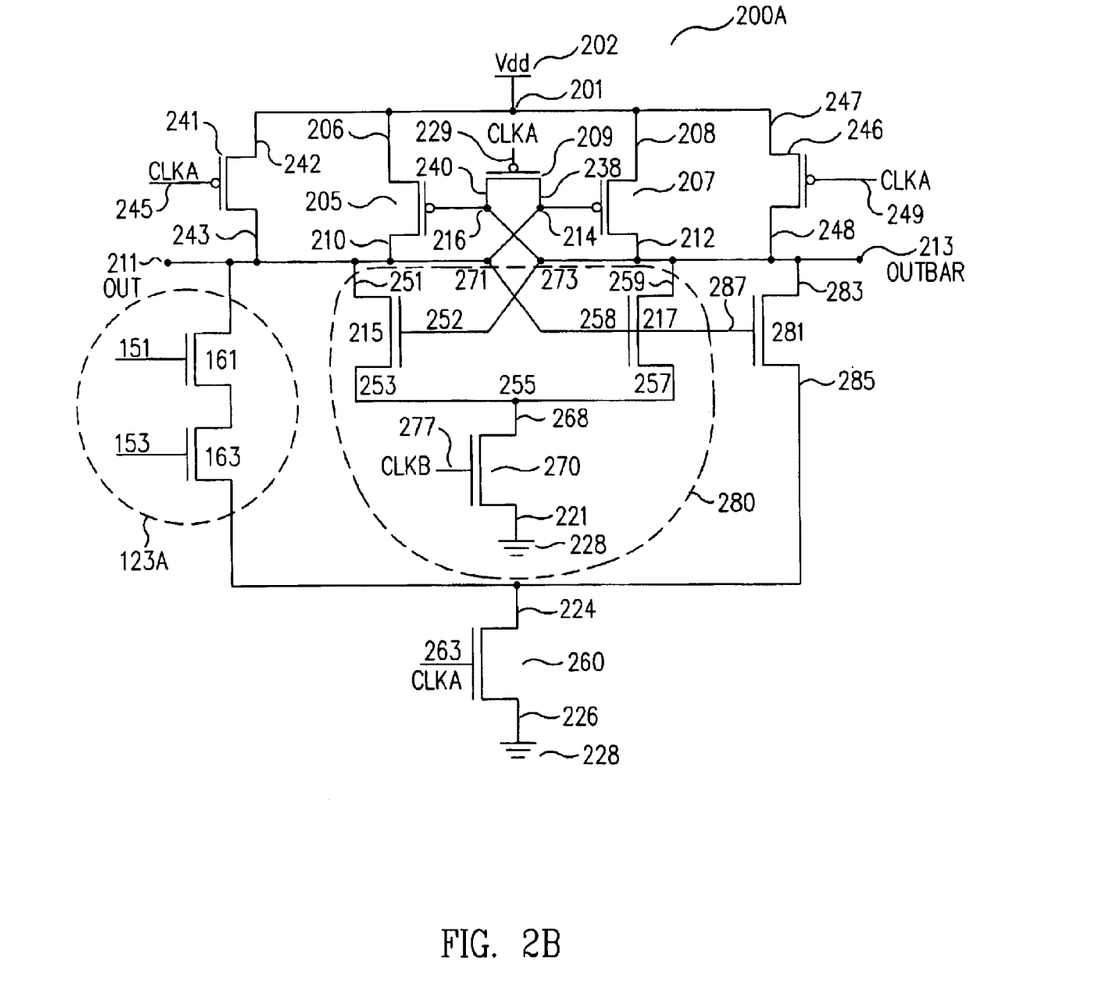
FIG. 2B shows one particular embodiment of a clocked full-rail differential logic circuit with sense amplifier and single-rail logic that includes a base logic portion that is an AND gate.

FIG. 2B shows one particular embodiment of a clocked full-rail differential logic circuit with sense amplifier and single-rail logic 200A that includes a base logic portion 123A that is an AND gate. As shown in FIG. 2B, AND gate 123A includes NFET 161 and NFET 163 connected in series. Input 151 is coupled to the control electrode, or gate, of NFET 161 and input 153 is coupled to the control electrode or gate of NFET 163. As also shown in FIG. 2B, according to the invention, NAND gate 123B of FIG. 1B, including NFET 171 and NFET 173, is replaced by single complementary output transistor 281 (FIG. 2B). Consequently, in this most simple example, using the method and structure of the invention results a significant reduction in components. Of course, those of skill in the art will recognize that when more complicated logic functions make up base logic portion 123A, using the present invention, even more components will be eliminated at an even greater savings in terms of dissipated power and heat, space, and circuit complexity.

As discussed above, clocked full-rail differential logic circuit with sense amplifier and single-rail logic 200 can be cascaded together with other clocked full-rail differential logic circuits with sense amplifier and single-rail logic 200 to form the chains commonly used in the industry. When clocked full-rail differential logic circuits with sense amplifier and single-rail logic 200 of the invention are cascaded together, the advantages of clocked full-rail differential logic circuit with sense amplifier and single-rail logic 200 is particularly evident and the gains in terms of efficiency, size reduction and flexibility are further pronounced.

When clocked full-rail differential logic circuits with sense amplifier and single-rail logic 200 of the invention are cascaded together, the delayed clock signal CLKA is, according to the invention, timed to be at least the delay of the previous clocked full-rail differential logic circuit with sense amplifier and single-rail logic 200 (not shown) to ensure each clocked full-rail differential logic circuit with sense amplifier and single-rail logic 200 of the invention is switched or "fired" only after it has received an input from the previous clocked full-rail differential logic circuit with sense amplifier and single-rail logic 200.

Figure 3:
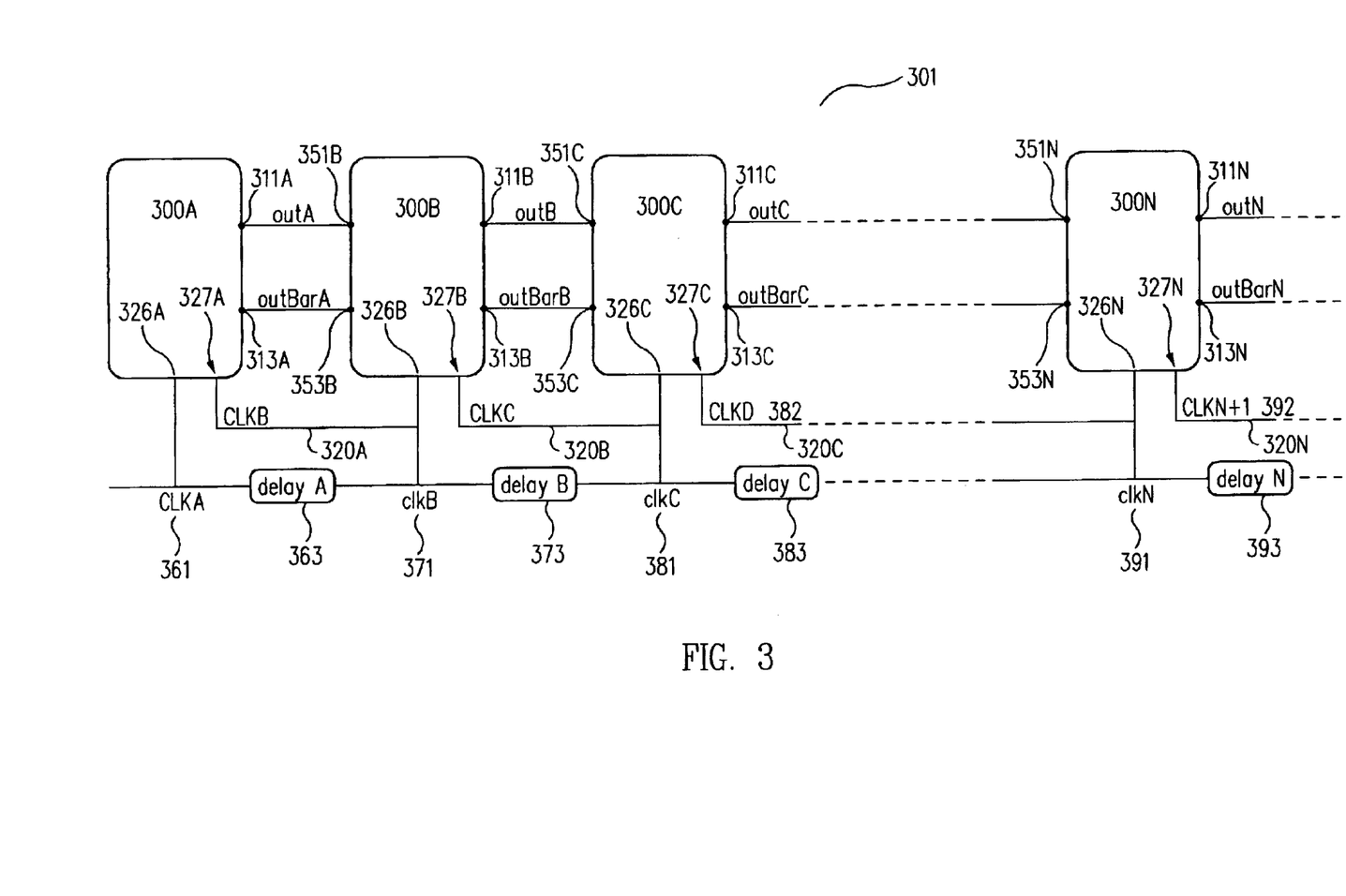
FIG. 3 shows one embodiment of a cascaded chain of clocked full-rail differential logic circuits with sense amplifier and single-rail logic according to the principles of the present invention.

FIG. 3 shows one embodiment of a cascaded chain 301 of clocked full-rail differential logic circuits with sense amplifier and single-rail logic 300A, 300B, 300C and 300N of the present invention. Each clocked full-rail differential logic circuit with sense amplifier and single-rail logic 300A, 300B, 300C and 300N represents a stage in cascaded chain 301. In one embodiment of the invention, each clocked full-rail differential logic circuit with sense amplifier and single-rail logic 300A, 300B, 300C and 300N is similar to clocked full-rail differential logic circuit with sense amplifier and single-rail logic 200 discussed above with respect to FIG. 2A.

As seen in FIG. 3, clocked full-rail differential logic circuit with sense amplifier and single-rail logic 300A includes: a first clock input terminal 326A; a second clock input terminal 327A; an out terminal 311A; and an outBar terminal 313A.

Clocked full-rail differential logic circuit with sense amplifier and single-rail logic 300B includes: a first clock input terminal 326B; a second clock input terminal 327B; an input terminal 351B, coupled to out terminal 311A of clocked full-rail differential logic circuit with sense amplifier and single-rail logic 300A; an inputBar terminal 353B, coupled to outBar terminal 313A of clocked full-rail differential logic circuit with sense amplifier and single-rail logic 300A; an output terminal 311B; and an outBar terminal 313B. Likewise, clocked full-rail differential logic circuit with sense amplifier and single-rail logic 300C includes: a first clock input terminal 326C; a second clock input terminal 327C; an input terminal 351C, coupled to output terminal 311B of clocked full-rail differential logic circuit with sense amplifier and single-rail logic 300B; an inputBar terminal 353C, coupled to outBar terminal 313B of clocked full-rail differential logic circuit with sense amplifier and single-rail logic 300B; an output terminal 311C; and an outBar terminal 313C.

Clocked full-rail differential logic circuit with sense amplifier and single-rail logic 300N includes: a first clock input terminal 326N;.a second clock input terminal 327N; an input terminal 351N, coupled to an output terminal 311N-1 (not shown) of a clocked full-rail differential logic circuit with sense amplifier and single-rail logic 300N-1 (not shown); an inputBar terminal 353N, coupled to an outBar terminal 313N-1 (not shown) of a clocked full-rail differential logic circuit with sense amplifier and single-rail logic 300N-1 (not shown); an output terminal 311N; and an outBar terminal 313N.

According to the invention, any number of clocked full-rail differential logic circuits with sense amplifier and single-rail logic 300A, 300B, 300C and 300N can be employed with cascaded chain 301. As also shown in FIG. 3, and discussed above, output terminal 311A of clocked full-rail differential logic circuit with sense amplifier and single-rail logic 300A couples signal OUTA to input terminal 351B of clocked full-rail differential logic circuit with sense amplifier and single-rail logic 300B and outBar terminal 313A of clocked full-rail differential logic circuit with sense amplifier and single-rail logic 300A couples signal OUTBARA to inputBar terminal 353B of clocked full-rail differential logic circuit with sense amplifier and single-rail logic 300B. Likewise, output terminal 311B of clocked full-rail differential logic circuit with sense amplifier and single-rail logic 300B couples signal OUTB to input terminal 351C of clocked full-rail differential logic circuit with sense amplifier and single-rail logic 300C and outBar terminal 313B of clocked full-rail differential logic circuit with sense amplifier and single-rail logic 300B couples signal OUTBARB to inputBar terminal 353C of clocked full-rail differential logic circuit with sense amplifier and single-rail logic 300C. In addition, output terminal 311N of clocked full-rail differential logic circuit with sense amplifier and single-rail logic 300N couples signal OUTN to an input terminal 351N+1 (not shown) of a clocked full-rail differential logic circuit with sense amplifier and single-rail logic 300N+1 (not shown) and outBar terminal 313N of clocked full-rail differential logic circuit with sense amplifier and single-rail logic 300N couples signal OUTBARN to an inputBar terminal 353N+1 (not shown) of a clocked full-rail differential logic circuit with sense amplifier and single-rail logic 300N+1 (not shown).

According to the invention, each clocked full-rail differential logic circuit with sense amplifier and single-rail logic 300A, 300B, 300C and 300N of cascaded chain 301 receives its own delayed first clock signal CLKA 361, CLKB 371, CLKC 381 and CLKN 391, respectively. According to the invention clock signals CLKA 361, CLKB 371, CLKC 381 and CLKN 391 are provided to clocked full-rail differential logic circuits with sense amplifier and single-rail logic 300A, 300B, 300C and 300N, respectively, by introducing delay circuits 363, 373, 383 and 393 between successive clocked full-rail differential logic circuits with sense amplifier and single-rail logic 300A, 300B, 300C and 300N. Consequently, delay circuit 363 introduces a delay time between signal CLKA 361, coupled to first clock input terminal 326A of clocked full-rail differential logic circuit with sense amplifier and single-rail logic 300A, and signal CLKB 371, coupled to first clock input terminal 326B of clocked full-rail differential logic circuit with sense amplifier and single-rail logic 300B. Delay circuit 373 introduces a delay time between signal CLKB 371 and signal CLKC 381, coupled to first clock input terminal 326C of clocked full-rail differential logic circuit with sense amplifier and single-rail logic 300C. Two delay circuits 363 and 373 introduce two delay times between signal CLKA 361 and signal CLKC 381. Likewise, a series of N–1 delay circuits, and N–1 delay times, exists between signal CLKA 361 and signal CLKN 391, coupled to first clock input terminal 326N of clocked full-rail differential logic circuit with sense amplifier and single-rail logic 300N, and a further delay circuit 393 introduces a further delay time between CLKN 391 and CLK N+1 (not shown) coupled to a first clock input terminal 326N+1 (not shown) of a clocked full-rail differential logic circuit with sense amplifier and single-rail logic 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each clocked full-rail differential logic circuit with sense amplifier and single-rail logic 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to clocked full-rail differential logic circuit with sense amplifier and single-rail logic 300A, 3008, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system.

In addition, according to the invention, each clocked full-rail differential logic circuit with sense amplifier and single-rail logic 300A, 3008, 300C and 300N of cascaded chain 301 receives a second delayed clock signal at its second clock input terminal 327A, 327B, 327C and 327N, respectively. In one embodiment of the invention, the second delayed clock signal for a given clocked full-rail differential logic circuit with sense amplifier and single-rail logic 300A, 300B, 300C and 300N of cascaded chain 301 is the delayed clock signal of the following clocked full-rail differential logic circuit with sense amplifier and single-rail logic 300A, 300B, 300C and 300N in cascaded chain 301. In this embodiment of the invention, the second delayed clock signal for a given clocked full-rail differential logic circuit with sense amplifier and single-rail logic 300A, 300B, 300C and 300N of cascaded chain 301 is provided by coupling the second clock terminal 327A, 327B, 327C and 327N of a given clocked full-rail differential logic circuit with sense amplifier and single-rail logic 300A, 300B, 300C and 300N, respectively, to the first clock input terminal 326B, 326C, 326D (not shown), 326N and 326N+1 (not shown) of the following stage 300B, 300C, 300N and 300N+1 (not shown).

Thus, in FIG. 3, line 320A couples second clock input terminal 327A of clocked full-rail differential logic circuit with sense amplifier and single-rail logic 300A to first clock input terminal 326B of clocked full-rail differential logic circuit with sense amplifier and single-rail logic 300B and delay circuit 363 introduces a delay time between signal CLKA 361, coupled to first clock input terminal 326A of clocked full-rail differential logic circuit with sense amplifier and single-rail logic 300A, and signal CLKB 371, coupled to second clock input terminal 327A of clocked full-rail differential logic circuit with sense amplifier and single-rail logic 300A. Likewise, line 320B couples second clock input terminal 327B of clocked full-rail differential logic circuit with sense amplifier and single-rail logic 300B to first clock input terminal 326C of clocked full-rail differential logic circuit with sense amplifier and single-rail logic 300C and delay circuit 373 introduces a delay time between signal CLKB 371, coupled to first clock input terminal 326B of clocked full-rail differential logic circuit with sense amplifier and single-rail logic 300B, and signal CLKC 381, coupled to second clock input terminal.327B of clocked full-rail differential logic circuit with sense amplifier and single-rail logic 300B.

Similarly, line 320C couples second clock input terminal 327C of clocked full-rail differential logic circuit with sense amplifier and single-rail logic 300C to first clock input terminal 326D (not shown) of a clocked full-rail differential logic circuit with sense amplifier and single-rail logic 300D (not shown) and delay circuit 383 introduces a delay time between signal CLKC 381, coupled to first clock input terminal 326C of clocked full-rail differential logic circuit with sense amplifier and single-rail logic 300C, and signal CLKD 382, coupled to second clock input terminal 327C of clocked full-rail differential logic circuit with sense amplifier and single-rail logic 300C. Likewise, line 320N couples first clock input terminal 326N+1 (not shown) of a clocked full-rail differential logic circuit with sense amplifier and single-rail logic 300N+1 (not shown) to second clock input terminal 327N of clocked full-rail differential logic circuit with sense amplifier and single-rail logic 300N and delay circuit 393 introduces a delay time between signal CLKN 391, coupled to first clock input terminal 326N of clocked full-rail differential logic circuit with sense amplifier and single-rail logic 300N, and signal CLKN+1 392, coupled to second clock input terminal 327N of clocked full-rail differential logic circuit with sense amplifier and single-rail logic 300N.

In one embodiment of the invention, second clock input terminals 327A, 327B, 327C and 327N of clocked full-rail differential logic circuits with sense amplifier and single-rail logic 300A, 300B, 300C and 300N, respectively, are coupled to a sense amplifiers (not shown in FIG. 3) in clocked full-rail differential logic circuits with sense amplifier and single-rail logic 300A, 300B, 300C and 300N, such as sense amplifier circuit 280 in FIG. 2, and the signals CLKB, CLKC, CLKD, and CLKN+1 are used as described above with respect to FIG. 2 to trigger the sense amplifiers (not shown in FIG. 3) in clocked full-rail differential logic circuits with sense amplifier and single-rail logic 300A, 300B, 300C and 300N.

Figure 4:
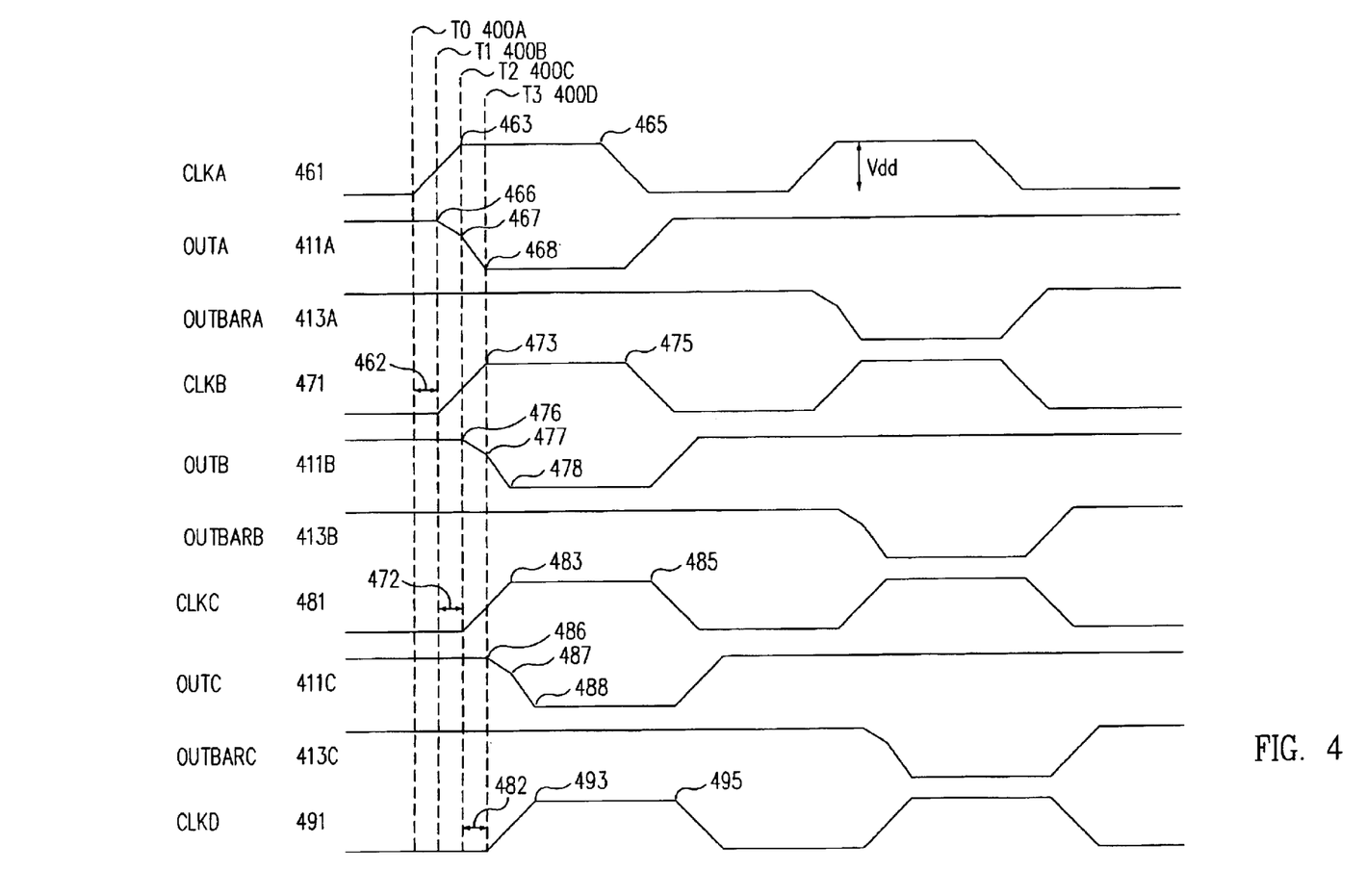
FIG. 4 is a one embodiment of a timing diagram for the cascaded chain of clocked full-rail differential logic circuits with sense amplifier and single-rail logic of the invention shown in FIG. 3.

FIG. 4 is one embodiment of a timing diagram for cascaded chain 301 of clocked full-rail differential logic circuits with sense amplifier and single-rail logic 300A, 300B, 300C, and 300N of FIG. 3. As seen in FIG. 3 and FIG. 4 together, according to one embodiment of the invention, at time TO, i.e., point TO 400A in FIG. 4: signal CLKA 461 begins to go high; OUTA 411A at out terminal 311A is high; OUTBARA 413A is high; CLKB 471 is low; OUTB 411B is high; OUTBARB 413B is high; CLKC 481 is low; OUTC is high; OUTBARC is high; and CLKD 491 is low.

A delay time 462 from point TO 400A and to point T1 400B is introduced by delay circuit 363. As discussed above, delay time 462 helps ensure clocked full-rail differential logic circuit with sense amplifier and single-rail logic 300B receives signals OUTA and OUTBARA from clocked full-rail differential logic circuit with sense amplifier and single-rail logic 300A before the switching of signal CLKB 471. As also discussed above, according to the invention, CLKB 471 also acts as the delayed clock signal to second clock input terminal 327A of clocked full-rail differential logic circuit with sense amplifier and single-rail logic 300A to serve as a trigger for a sense amplifier circuit, such as sense amplifier circuit 280 of FIG. 2, that is used in clocked full-rail differential logic circuit with sense amplifier and single-rail logic 300A.

At time T1, i.e., point T1 400B in FIG. 4: signal CLKA 461 continues to go high; OUTA 411A starts to slowly go low at point 466; signal OUTBARA at outBar terminal 313A remains high; CLKB 471 starts to go high; OUTB 411B remains high; OUTBARB 413B remains high; CLKC 481 remains low; OUTC remains high; OUTBARC remains high; and CLKD 491 remains low.

A delay time 472 from point T1 400B and to point T2 400C is introduced by delay circuit 373. As discussed above, delay time 472 helps ensure clocked full-rail differential logic circuit with sense amplifier and single-rail logic 300C receives signals OUTB and OUTBARB from clocked full-rail differential logic circuit with sense amplifier and single-rail logic 300B before the switching of signal CLKC 481. As also discussed above, according to the invention, CLKC 481 also acts as the delayed clock signal to second clock input terminal 327B of clocked full-rail differential logic circuit with sense amplifier and single-rail logic 300B to serve as a trigger for a sense amplifier circuit, such as sense amplifier circuit 280 of FIG. 2, that is used in clocked full-rail differential logic circuit with sense amplifier and single-rail logic 300B.

At time T2, i.e., point T2 400C in FIG. 4: signal CLKA 461 reaches high point 463; the sense amplifier, such as sense amplifier 280 in FIG. 2, which, according to the invention, is part of clocked full-rail differential logic circuit with sense amplifier and single-rail logic 300A is activated and Output OUTA 411A pulls strongly low starting at point 467, note the difference in the slope of signal OUTA 411A between points 466 and 467, when the sense amplifier is not activated, and points 467 and 468, when the sense amplifier is activated; OUTBARA remains high; CLKB 471 continues to go high; OUTB 411B begins to slowly go low at point 476; OUTBARB 413B remains high; CLKC 481 starts to go high; OUTC remains high; OUTBARC remains high; and CLKD 491 remains low.

A delay time 482 from point T2 400C and to point T3 400D is introduced by delay circuit 383. As discussed above, delay time 482 helps ensure clocked full-rail differential logic circuit with sense amplifier and single-rail logic 300D (not shown) receives signals OUTC and OUTBARC from clocked full-rail differential logic circuit with sense amplifier and single-rail logic 300C before the switching of signal CLKD 491. As also discussed above, according to the invention, CLKC 491 also acts as the delayed clock signal to second clock input terminal 327C of clocked full-rail differential logic circuit with sense amplifier and single-rail logic 300C to serve as a trigger for a sense amplifier circuit, such as sense amplifier circuit 280 of FIG. 2, that is used in clocked full-rail differential logic circuit with sense amplifier and single-rail logic 300C.

At time T3, i.e., point T3 400D in FIG. 4: signal CLKA remains high; OUTA reaches low point 468; OUTBARA remains high; CLKB 471 reaches high point 473; the sense amplifier, such as sense amplifier 280 in FIG. 2, which, according to the invention, is part of clocked full-rail differential logic circuit with sense amplifier and single-rail logic 300B is activated and Output OUTB 411B pulls strongly low starting at point 477, note the difference in the slope of signal OUTB 411B between points .476 and 477, when the sense amplifier is not activated, and points 477 and 478, when the sense amplifier is activated; CLKC 481 continues to go high; OUTC begins to slowly go low at point 486; OUTBARC remains high; and CLKD 491 begins to go high. As discussed above, according to the invention, any number of clocked full-rail differential logic circuits with sense amplifier and single-rail logic 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As discussed above, clocked full-rail differential logic circuits with sense amplifier and single-rail logic 200, 200A, 300A, 300B, 300C and 300N of the invention include sense amplifier circuit 280 that is triggered by the delayed clock of the following stage, i.e., the clock input to the sense amplifier circuit of the clocked full-rail differential logic circuits with sense amplifier and single-rail logic of the invention is additionally delayed with respect to the delayed clock that drives the full-rail differential logic. The addition of the sense amplifier circuit, and second delayed clock signal, according to the invention, allows the sense amplifier circuit to act as the driver and therefore there is no need for increasing the size of the logic network to provide the driver function. Consequently, the clocked full-rail differential logic circuits with sense amplifier and single-rail logic of the invention are capable of operating efficiently under heavy load conditions without the increased size and the significant reduction in speed associated with prior art full-rail differential logic circuits. In addition, the clocked full-rail differential logic circuits with sense amplifier and single-rail logic of the invention require less space, are simpler, dissipate less heat and have fewer components to potentially fail.

In addition, according to the invention, the complementary logic function of the prior art is replaced by a single transistor appropriately sized to provide the complementary output OUTBAR. Consequently, clocked full-rail differential logic circuits with sense amplifier and single-rail logic of the invention use less power and, therefore, generate less heat, require less space, and are simpler in design so that they are more flexible, more space efficient and more reliable than prior art full-rail differential logic circuits.

As also discussed above, the clocked full-rail differential logic circuits with sense amplifier and single-rail logic of the invention can be cascaded together to form the chains commonly used in the industry. When the clocked full-rail differential logic circuits with sense amplifier and single-rail logic of the invention are cascaded together, the advantages of the clocked full-rail differential logic circuits with sense amplifier and single-rail logic of the invention are particularly evident and the gains in terms of efficiency, size reduction and flexibility are further pronounced.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A cascaded chain of clocked full-rail differential logic circuits with sense amplifier and single-rail logic comprising:
   a first supply voltage;
   a second supply voltage;
   a first clocked full-rail differential logic circuit with sense amplifier and single-rail logic, said first clocked full-rail differential logic circuit with sense amplifier and single-rail logic comprising:
      a first clocked full-rail differential logic circuit with sense amplifier and single-rail logic out terminal;
      a first clocked full-rail differential logic circuit with sense amplifier and single-rail logic outBar terminal;
      a first clocked full-rail differential logic circuit with sense amplifier and single-rail logic first node, said first clocked full-rail differential logic circuit with sense amplifier and single-rail logic first node being coupled to said first supply voltage;
      a first transistor, said first transistor comprising a first transistor first flow electrode, a first transistor second flow electrode and a first transistor control electrode, said first clocked full-rail differential logic circuit with sense amplifier and single-rail logic first node being coupled to said first transistor first flow electrode, said first transistor second flow electrode being coupled to said first clocked full-rail differential logic circuit with sense amplifier and single-rail logic out terminal;
      a second transistor, said second transistor comprising a second transistor first flow electrode, a second transistor second flow electrode and a second transistor control electrode, said first clocked full-rail differential logic circuit with sense amplifier and single-rail logic first node being coupled to said second transistor first flow electrode, said second transistor second flow electrode being coupled to said first clocked full-rail differential logic circuit with sense amplifier and single-rail logic outBar terminal;
      a third transistor, said third transistor comprising a third transistor first flow electrode, a third transistor second flow electrode and a third transistor control electrode, said first transistor control electrode being coupled to said third transistor first flow electrode and said first clocked full-rail differential logic circuit with sense amplifier and single-rail logic outBar terminal, said second transistor control electrode being coupled to said third transistor second flow electrode and said first clocked full-rail differential logic circuit with sense amplifier and single-rail logic out terminal;
      a fourth transistor, said fourth transistor comprising a fourth transistor first flow electrode, a fourth transistor second flow electrode and a fourth transistor control electrode; said fourth transistor first flow electrode being coupled to said first clocked full-rail differential logic circuit with sense amplifier and single-rail logic first node, said fourth transistor second flow electrode being coupled to said first clocked full-rail differential logic circuit with sense amplifier and single-rail logic out terminal, said fourth transistor control electrode being coupled to a first clock signal;
      a fifth transistor, said fifth transistor comprising a fifth transistor first flow electrode, a fifth transistor second flow electrode and a fifth transistor control electrode; said fifth transistor first flow electrode being coupled to said first clocked full-rail differential logic circuit with sense amplifier and single-rail logic first node, said fifth transistor second flow electrode being coupled to said first clocked full-rail differential logic circuit with sense amplifier and single-rail logic outBar terminal, said fifth transistor control electrode being coupled to said first clock signal;
      a first clocked full-rail differential logic circuit with sense amplifier and single-rail logic sense amplifier circuit coupled between said first clocked full-rail differential logic circuit with sense amplifier and single-rail logic out terminal and said first clocked full-rail differential logic circuit with sense amplifier and single-rail logic outBar terminal, said first clocked full-rail differential logic circuit with sense amplifier and single-rail logic sense amplifier circuit having an input terminal coupled to a second clock signal;
      a base logic portion, said base logic portion comprising a base logic portion first input terminal, a base logic portion second input terminal, a base logic portion OUT terminal, and a base logic portion fourth terminal, said base logic portion OUT terminal being coupled to said first clocked full-rail differential logic circuit with sense amplifier and single-rail logic OUT terminal;
      a complementary output transistor, said complementary output transistor comprising a complementary output transistor first flow electrode, a complementary output transistor second flow electrode and a complementary output transistor control electrode, said complementary output transistor first flow electrode being coupled to said third transistor first flow electrode and said first clocked full-rail differential logic circuit with sense amplifier and single-rail logic OUTBAR terminal, said complementary output transistor second flow electrode being coupled to a first clocked full-rail differential logic circuit with sense amplifier and single-rail logic second node, said complementary output transistor control electrode being coupled to said third transistor second flow electrode and said first clocked full-rail differential logic circuit with sense amplifier and single-rail logic OUT terminal;
   a second clocked full-rail differential logic circuit with sense amplifier and single-rail logic said second clocked full-rail differential logic circuit with sense amplifier and single-rail logic comprising:
      a second clocked full-rail differential logic circuit with sense amplifier and single-rail logic out terminal;
      a second clocked full-rail differential logic circuit with sense amplifier and single-rail logic outBar terminal;
      a second clocked full-rail differential logic circuit with sense amplifier and single-rail logic first node, said second clocked full-rail differential logic circuit with sense amplifier and single-rail logic first node being coupled to said first supply voltage;
      a first transistor, said first transistor comprising a first transistor first flow electrode, a first transistor second flow electrode and a first transistor control electrode, said second clocked full-rail differential logic circuit with sense amplifier and single-rail logic first node being coupled to said first transistor first flow electrode, said first transistor second flow electrode being coupled to said second clocked full-rail differential logic circuit with sense amplifier and single-rail logic out terminal;

a second transistor, said second transistor comprising a second transistor first flow electrode, a second transistor second flow electrode and a second transistor control electrode, said second clocked full-rail differential logic circuit with sense amplifier and single-rail logic first node being coupled to said second transistor first flow electrode, said second transistor second flow electrode being coupled to said second clocked full-rail differential logic circuit with sense amplifier and single-rail logic outBar terminal;

a third transistor, said third transistor comprising a third transistor first flow electrode, a third transistor second flow electrode and a third transistor control electrode, said first transistor control electrode being coupled to said third transistor first flow electrode and said second clocked full-rail differential logic circuit with sense amplifier and single-rail logic outBar terminal, said second transistor control electrode being coupled to said third transistor second flow electrode and said second clocked full-rail differential logic circuit with sense amplifier and single-rail logic out terminal;

a fourth transistor, said fourth transistor comprising a fourth transistor first flow electrode, a fourth transistor second flow electrode and a fourth transistor control electrode; said fourth transistor first flow electrode being coupled to said second clocked full-rail differential logic circuit with sense amplifier and single-rail logic first node, said fourth transistor second flow electrode being coupled to said second clocked full-rail differential logic circuit with sense amplifier and single-rail logic out terminal, said fourth transistor control electrode being coupled to said second clock signal;

a fifth transistor, said fifth transistor comprising a fifth transistor first flow electrode, a fifth transistor second flow electrode and a fifth transistor control electrode; said fifth transistor first flow electrode being coupled to said second clocked full-rail differential logic circuit with sense amplifier and single-rail logic first node, said fifth transistor second flow electrode being coupled to said second clocked full-rail differential logic circuit with sense amplifier and single-rail logic outBar terminal, said fifth transistor control electrode being coupled to said second clock signal;

a second clocked full-rail differential logic circuit with sense amplifier and single-rail logic sense amplifier circuit coupled between said second clocked full-rail differential logic circuit with sense amplifier and single-rail logic out terminal and said second clocked full-rail differential logic circuit with sense amplifier and single-rail logic outBar terminal, said second clocked full-rail differential logic circuit with sense amplifier and single-rail logic sense amplifier circuit having an input terminal coupled to a third clock signal;

a base logic portion, said base logic portion comprising a base logic portion first input terminal, a base logic portion second input terminal, a base logic portion OUT terminal, and a base logic portion fourth terminal, said base logic portion OUT terminal being coupled to said second clocked full-rail differential logic circuit with sense amplifier and single-rail logic OUT terminal;

a complementary output transistor, said complementary output transistor comprising a complementary output transistor first flow electrode, a complementary output transistor second flow electrode and a complementary output transistor control electrode, said complementary output transistor first flow electrode being coupled to said third transistor first flow electrode and said second clocked full-rail differential logic circuit with sense amplifier and single-rail logic OUTBAR terminal, said complementary output transistor second flow electrode being coupled to a second clocked full-rail differential logic circuit with sense amplifier and single-rail logic second node, said complementary output transistor control electrode being coupled to said third transistor second flow electrode and said second clocked full-rail differential logic circuit with sense amplifier and single-rail logic OUT terminal, wherein;

said second clock signal is delayed with respect to said first clock signal by a predetermined delay time and said third clock signal is delayed with respect to said second clock signal by a predetermined delay time.

2. The cascaded chain of clocked full-rail differential logic circuits with sense amplifier and single-rail logic of claim 1, wherein;

said first clocked full-rail differential logic circuit with sense amplifier and single-rail logic sense amplifier circuit comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to a first clocked full-rail differential logic circuit with sense amplifier and single-rail logic third node, said sixth transistor control electrode being coupled to said third transistor first flow electrode and said first clocked full-rail differential logic circuit with sense amplifier and single-rail logic outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said first clocked full-rail differential logic circuit with sense amplifier and single-rail logic third node, said seventh transistor control electrode being coupled to said third transistor second flow electrode and said first clocked full-rail differential logic circuit with sense amplifier and single-rail logic out terminal;

an eighth transistor, said eighth transistor comprising an eighth transistor first flow electrode, an eighth transistor second flow electrode and an eighth transistor control electrode, said eighth transistor first flow electrode being coupled to said first clocked full-rail differential logic circuit with sense amplifier and single-rail logic third node, said eighth transistor second flow electrode being coupled to said second supply voltage, said eighth transistor control electrode being coupled to receive said second clock signal, further wherein;

said a second clocked full-rail differential logic circuit with sense amplifier and single-rail logic sense amplifier circuit comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to a second clocked full-rail differential logic circuit with sense amplifier and single-rail logic third node, said sixth transistor control electrode being coupled to said third transistor first flow electrode and said second clocked full-rail differential logic circuit with sense amplifier and single-rail logic outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said second clocked full-rail differential logic circuit with sense amplifier and single-rail logic third node, said seventh transistor control electrode being coupled to said third transistor second flow electrode and said second clocked full-rail differential logic circuit with sense amplifier and single-rail logic out terminal;

an eighth transistor, said eighth transistor comprising an eighth transistor first flow electrode, an eighth transistor second flow electrode and an eighth transistor control electrode, said eighth transistor first flow electrode being coupled to said second clocked full-rail differential logic circuit with sense amplifier and single-rail logic third node, said eighth transistor second flow electrode being coupled to said second supply voltage, said eighth transistor control electrode being coupled to receive said third clock signal.

3. The cascaded chain of clocked full-rail differential logic circuits with sense amplifier and single-rail logic of claim 1, wherein;

said base logic portion of said first clocked full-rail differential logic circuit with sense amplifier and single-rail logic and said base logic portion of said second clocked full-rail differential logic circuit with sense amplifier and single-rail logic comprise logic gates.

4. The cascaded chain of clocked full-rail differential logic circuits with sense amplifier and single-rail logic of claim 1, wherein;

said base logic portion of said first clocked full-rail differential logic circuit with sense amplifier and single-rail logic and said base logic portion of said second clocked full-rail differential logic circuit with sense amplifier and single-rail logic comprise NMOS pass transistor logic;

said base logic portion of said first clocked full-rail differential logic circuit with sense amplifier and single-rail logic comprises at least one control variable input and at least one pass variable input; and said base logic portion of said second clocked full-rail differential logic circuit with sense amplifier and single-rail logic comprises at least one control variable input and at least one pass variable input.

5. The cascaded chain of clocked full-rail differential logic circuits with sense amplifier and single-rail logic of claim 1, wherein;

said first supply voltage is Vdd and said second supply voltage is ground.

6. The cascaded chain of clocked full-rail differential logic circuits with sense amplifier and single-rail logic of claim 5, wherein;

said first transistor, said second transistor, said third transistor, said fourth transistor and said fifth transistor of said first clocked full-rail differential logic circuit with sense amplifier and single-rail logic and said first transistor, said second transistor, said third transistor, said fourth transistor and said fifth transistor of said second clocked full-rail differential logic circuit with sense amplifier and single-rail logic are PFETs.

7. The cascaded chain of clocked full-rail differential logic circuits with sense amplifier and single-rail logic of claim 6, wherein;

said sixth transistor, said seventh transistor and said eighth transistor of said first clocked full-rail differential logic circuit with sense amplifier and single-rail logic and said fourth transistor, said sixth transistor, said seventh transistor and said eighth transistor of said second clocked full-rail differential logic circuit with sense amplifier and single-rail logic are NFETS.

8. A clocked full-rail differential logic circuit with sense amplifier and single-rail logic comprising:

a first supply voltage;

a second supply voltage;

a clocked full-rail differential logic circuit with sense amplifier and single-rail logic out terminal;

a clocked full-rail differential logic circuit with sense amplifier and single-rail logic outBar terminal;

a clocked full-rail differential logic circuit with sense amplifier and single-rail logic first node, said clocked full-rail differential logic circuit with sense amplifier and single-rail logic first node being coupled to said first supply voltage;

a first transistor, said first transistor comprising a first transistor first flow electrode, a first transistor second flow electrode and a first transistor control electrode, said clocked full-rail differential logic circuit with sense amplifier and single-rail logic first node being coupled to said first transistor first flow electrode, said first transistor second flow electrode being coupled to said clocked full-rail differential logic circuit with sense amplifier and single-rail logic out terminal;

a second transistor, said second transistor comprising a second transistor first flow electrode, a second transistor second flow electrode and a second transistor control electrode, said clocked full-rail differential logic circuit with sense amplifier and single-rail logic first node being coupled to said second transistor first flow electrode, said second transistor second flow electrode being coupled to said clocked full-rail differential logic circuit with sense amplifier and single-rail logic outBar terminal;

a third transistor, said third transistor comprising a third transistor first flow electrode, a third transistor second flow electrode and a third transistor control electrode, said first transistor control electrode being coupled to said third transistor first flow electrode and said clocked full-rail differential logic circuit with sense amplifier and single-rail logic outBar terminal, said second transistor control electrode being coupled to said third transistor second flow electrode and said clocked full-rail differential logic circuit with sense amplifier and single-rail logic out terminal;

a fourth transistor, said fourth transistor comprising a fourth transistor first flow electrode, a fourth transistor second flow electrode and a fourth transistor control electrode; said fourth transistor first flow electrode being coupled to said clocked full-rail differential logic circuit with sense amplifier and single-rail logic first node, said fourth transistor second flow electrode being coupled to said clocked full-rail differential logic circuit with sense amplifier and single-rail logic out terminal, said fourth transistor control electrode being coupled a first clock signal;

a fifth transistor, said fifth transistor comprising a fifth transistor first flow electrode, a fifth transistor second flow electrode and a fifth transistor control electrode; said fifth transistor first flow electrode being coupled to said clocked full-rail differential logic circuit with sense amplifier and single-rail logic first node, said fifth transistor second flow electrode being coupled to said clocked full-rail differential logic circuit with sense amplifier and single-rail logic outBar terminal, said fifth transistor control electrode being coupled said first clock signal;

a clocked full-rail differential logic circuit with sense amplifier and single-rail logic sense amplifier circuit coupled between said clocked full-rail differential logic circuit with sense amplifier and single-rail logic out terminal and said clocked full-rail differential logic circuit with sense amplifier and single-rail logic outBar terminal, said clocked full-rail differential logic circuit with sense amplifier and single-rail logic sense amplifier circuit having an input terminal coupled to a second clock signal;

a base logic portion, said base logic portion comprising a base logic portion first input terminal, a base logic portion second input terminal, a base logic portion OUT terminal, and a base logic portion fourth terminal, said base logic portion OUT terminal being coupled to said clocked full-rail differential logic circuit with sense amplifier and single-rail logic OUT terminal;

a complementary output transistor, said complementary output transistor comprising a complementary output transistor first flow electrode, a complementary output transistor second flow electrode and a complementary output transistor control electrode, said complementary output transistor first flow electrode being coupled to said third transistor first flow electrode and said clocked full-rail differential logic circuit with sense amplifier and single-rail logic OUTBAR terminal, said complementary output transistor second flow electrode being coupled to a clocked full-rail differential logic circuit with sense amplifier and single-rail logic second node, said complementary output transistor control electrode being coupled to said third transistor second flow electrode and said clocked full-rail differential logic circuit with sense amplifier and single-rail logic OUT terminal, wherein;

said second clock signal is delayed with respect to said first clock signal by a predetermined time.

9. The clocked full-rail differential logic circuit with sense amplifier and single-rail logic of claim 8, wherein;

said clocked full-rail differential logic circuit with sense amplifier and single-rail logic sense amplifier circuit comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to a clocked full-rail differential logic circuit with sense amplifier and single-rail logic third node, said sixth transistor control electrode being coupled to said third transistor first flow electrode and said clocked full-rail differential logic circuit with sense amplifier and single-rail logic outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said clocked full-rail differential logic circuit with sense amplifier and single-rail logic third node, said seventh transistor control electrode being coupled to said third transistor second flow electrode and said clocked full-rail differential logic circuit with sense amplifier and single-rail logic out terminal;

an eighth transistor, said eighth transistor comprising an eighth transistor first flow electrode, an eighth transistor second flow electrode and an eighth transistor control electrode, said eighth transistor first flow electrode being coupled to said clocked full-rail differential logic circuit with sense amplifier and single-rail logic third node, said eighth transistor second flow electrode being coupled to said second supply voltage, said eighth transistor control electrode being coupled to receive said second clock signal.

10. The clocked full-rail differential logic circuit with sense amplifier and single-rail logic of claim 9, wherein;

said base logic portion of said clocked full-rail differential logic circuit with sense amplifier and single-rail logic comprises differential logic.

11. The clocked full-rail differential logic circuit with sense amplifier and single-rail logic of claim 9, wherein;
   said base logic portion of said clocked full-rail differential logic circuit with sense amplifier and single-rail logic comprises differential logic gates.

12. The clocked full-rail differential logic circuit with sense amplifier and single-rail logic of claim 9, wherein;
   said base logic portion of said clocked full-rail differential logic circuit with sense amplifier and single-rail logic comprises NMOS pass transistor logic; and
   said base logic portion of said clocked full-rail differential logic circuit with sense amplifier and single-rail logic includes at least one control variable input and at least one pass variable input.

13. The clocked full-rail differential logic circuit with sense amplifier and single-rail logic of claim 9, wherein;
   said first supply voltage is Vdd and said second supply voltage is ground.

14. The clocked full-rail differential logic circuit with sense amplifier and single-rail logic of claim 13, wherein;
   said first transistor, said second transistor, said third transistor, said fourth transistor and said fifth transistor are PFETs.

15. The clocked full-rail differential logic circuit with sense amplifier and single-rail logic of claim 14, wherein;
   said sixth transistor, said seventh transistor and said eighth transistor are NFETs.

* * * * *